(12) United States Patent
Cheng

(10) Patent No.: US 8,587,024 B2
(45) Date of Patent: Nov. 19, 2013

(54) VERTICAL JUNCTION FIELD EFFECT TRANSISTORS AND BIPOLAR JUNCTION TRANSISTORS

(75) Inventor: Lin Cheng, Starkville, MS (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/613,295

(22) Filed: Sep. 13, 2012

(65) Prior Publication Data

US 2013/0009169 A1  Jan. 10, 2013

Related U.S. Application Data

(62) Division of application No. 12/818,281, filed on Jun. 18, 2010, now Pat. No. 8,338,255.

(60) Provisional application No. 61/218,751, filed on Jun. 19, 2009.

(51) Int. Cl.
*H01L 29/66* (2006.01)

(52) U.S. Cl.
USPC .................. 257/135; 257/E21.445; 438/269

(58) Field of Classification Search
USPC .................. 257/77, 134–137, 280, 284, 471, 257/E21.445, E21.054; 438/136, 137, 156, 438/186, 195, 269, 520
See application file for complete search history.

(56) References Cited

U.S. PATENT DOCUMENTS

| 6,278,143 B1 | 8/2001 | Ejiri | |
|---|---|---|---|
| 2005/0233539 A1* | 10/2005 | Takeuchi et al. | 438/400 |
| 2006/0113561 A1* | 6/2006 | Sankin et al. | 257/134 |
| 2007/0012946 A1* | 1/2007 | Sankin et al. | 257/134 |
| 2007/0029573 A1* | 2/2007 | Cheng et al. | 257/135 |
| 2007/0187715 A1* | 8/2007 | Zhao | 257/135 |
| 2007/0290212 A1* | 12/2007 | Mazzola | 257/77 |
| 2008/0003731 A1* | 1/2008 | Mazzola et al. | 438/192 |
| 2008/0061362 A1* | 3/2008 | Merrett et al. | 257/329 |
| 2008/0093637 A1* | 4/2008 | Sankin et al. | 257/263 |
| 2008/0124853 A1* | 5/2008 | Cheng et al. | 438/193 |
| 2008/0251793 A1* | 10/2008 | Mazzola et al. | 257/77 |
| 2008/0308838 A1* | 12/2008 | McNutt et al. | 257/133 |
| 2009/0278137 A1* | 11/2009 | Sheridan et al. | 257/77 |
| 2010/0078754 A1* | 4/2010 | Veliadis et al. | 257/491 |
| 2010/0148186 A1* | 6/2010 | Sheridan et al. | 257/77 |
| 2010/0295102 A1* | 11/2010 | Sankin et al. | 257/265 |
| 2010/0320476 A1* | 12/2010 | Cheng et al. | 257/77 |
| 2011/0133212 A1* | 6/2011 | Sheridan et al. | 257/77 |

FOREIGN PATENT DOCUMENTS

| KR | 10-20070062969 A | 6/2007 |
|---|---|---|
| WO | 2007018578 A2 | 2/2007 |

OTHER PUBLICATIONS

International Search Report and the Written Opinion of the International Searching Authority issued in related International Application No. PCT/US2010/039114.

\* cited by examiner

*Primary Examiner* — William F Kraig

(57) ABSTRACT

Methods of making semiconductor devices such as vertical junction field effect transistors (VJFETs) or bipolar junction transistors (BJTs) are described. The methods do not require ion implantation. The VJFET device has an epitaxially regrown n-type channel layer and an epitaxially regrown p-type gate layer as well as an epitaxially grown buried gate layer. Devices made by the methods are also described.

18 Claims, 9 Drawing Sheets

VERTICAL JUNCTION FIELD EFFECT TRANSISTORS AND BIPOLAR JUNCTION TRANSISTORS

This application is a divisional of U.S. patent application Ser. No. 12/818,281, filed on Jun. 18, 2010, pending, which claims the benefit of Provisional U.S. Patent Application Ser. No. 61/218,751, filed on Jun. 19, 2009. Each of the above applications is incorporated by reference herein in its entirety.

The section headings used herein are for organizational purposes only and should not be construed as limiting the subject matter described herein in any way.

BACKGROUND

1. Field

This application relates generally to semiconductor devices and to methods of making the devices.

2. Background of the Technology

A field-effect transistor (FET) is a type of transistor commonly used for weak-signal amplification (e.g., for amplifying wireless signals). The device can amplify analog or digital signals. It can also switch DC or function as an oscillator. In an FET, current flows along a semiconductor path called the channel. At one end of the channel, there is an electrode called the source. At the other end of the channel, there is an electrode called the drain. The physical diameter of the channel is fixed, but its effective electrical diameter can be varied by the application of a voltage to a control electrode called the gate. The conductivity of the FET depends, at any given instant in time, on the electrical diameter of the channel. A small change in gate voltage can cause a large variation in the current from the source to the drain. This is how the FET amplifies signals.

The gate of an FET can be a metal-semiconductor Schottky barrier (MESFET), a p-n junction (JFET), or a metal-oxide-semiconductor gate (MOSFET). The p-n junction FET (JFET) has a channel of N-type semiconductor (N-channel) or P-type semiconductor (P-channel) material and a gate of semiconductor material of the opposite semiconductor type on the channel. The Metal-Semiconductor-Field-Effect-Transistor (MESFET) has a channel of N-type or P-type semiconductor material and a Schottky metal gate on the channel.

Bipolar junction transistors (BJTs) are semiconductor devices having two back-to-back PN junctions. BJTs have a thin and typically lightly doped central region known as the base (B) having majority charge carriers of opposite polarity to those in the surrounding material. The two outer regions of the device are known as the emitter (E) and the collector (C). Under the proper operating conditions, the emitter injects majority charge carriers into the base region. Because the base is thin, most of these charge carriers will ultimately reach the collector. The emitter is typically highly doped to reduce resistance and the collector is typically lightly doped to reduce the junction capacitance of the collector-base junction.

Semiconductor devices such as FETs and BJTs are typically made using ion implantation techniques. Ion implantation, however, requires high temperature post implant anneals which increases the time required to manufacture the device and which can result in damage to the device.

Accordingly, there still exists a need for improved methods of making semiconductor devices such as FETs and BJTs which do not involve ion implantation.

SUMMARY

A method of making a semiconductor device is provided which comprises:

forming a first etch mask on an n-type source layer, wherein the n-type source layer is on an n-type isolation layer, wherein the n-type isolation layer is on a p-type buried gate layer, wherein the p-type buried gate layer is on an n-type drift layer, wherein the n-type drift layer is on an n-type buffer layer and wherein the n-type buffer layer is on an n-type substrate;

selectively etching through the source and isolation layers and into the buried gate layer using the first etch mask to form raised source regions having upper surfaces and sidewalls and exposing buried gate layer adjacent the raised regions;

positioning a second etch mask on exposed buried gate layer in a peripheral portion of the device;

selectively etching through the buried gate layer using the first and second etch masks to expose n-type drift layer adjacent the raised regions thereby forming a region of p-type material in the peripheral portion of the device having an upper surface and sidewalls, wherein the p-type material in the raised source regions is in contact with the region of p-type material in the peripheral portion of the device;

removing the first and second etch masks;

epitaxially growing an n-type channel layer on the upper surfaces and sidewalls of the raised regions, on the exposed surfaces of the drift layer adjacent the raised regions and on the region of p-type material in the peripheral portion of the device;

selectively etching the n-type channel layer to expose the source layer on the upper surfaces of the raised regions, the drift layer adjacent the raised regions and the upper surface of the region of p-type material in the peripheral portion of the device;

epitaxially growing a p-type gate layer on the upper surfaces of the raised regions, on the n-type channel layer on the sidewalls of the raised regions, on the exposed surfaces of the drift layer and on the region of p-type material in the peripheral portion of the device;

filling the etched features with a first planarizing material;

etching the first planarizing material to remove the epitaxially grown p-type gate layer from the upper surfaces of the raised regions;

removing the first planarizing material;

depositing an oxide layer on the sidewalls of the raised regions;

forming ohmic contacts on the upper surfaces of the raised regions, on the epitaxially grown p-type gate layer adjacent the raised regions and on the epitaxially grown p-type gate layer in the peripheral region of the device;

forming an ohmic contact on the substrate layer opposite the buffer layer;

depositing etch mask material on the ohmic contact material on the epitaxially grown p-type gate layer and on the ohmic contact material on the upper surfaces of the raised regions such that epitaxially grown channel and gate layer on the sidewalls of the raised regions is not masked;

filling the etched features with a second planarizing material;

etching the second planarizing material to remove the epitaxially grown p-type gate and n-type channel layers from an upper portion of the sidewalls of the raised regions;

removing the second planarizing material and the etch mask material;

filling the etched features with a third planarizing material;

etching the third planarizing material to expose ohmic contact material on the upper surfaces of the raised regions;

selectively etching through the third planarizing material in the peripheral portion of the device to expose ohmic contact material on the epitaxially grown p-type gate layer;

forming metal contacts on the ohmic contacts on the upper surfaces of the raised regions;

forming a metal contact on the ohmic contact on the epitaxially grown p-type gate layer in the peripheral portion of the device; and forming a metal contact on the ohmic contact on the substrate layer.

A semiconductor device made by the above method is also provided.

A circuit comprising one or more semiconductor devices as set forth above is also provided.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

For the purposes of interpreting this specification, the use of "or" herein means "and/or" unless stated otherwise or where the use of "and/or" is clearly inappropriate. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of." It should also be understood that in some embodiments the order of steps or order for performing certain actions is immaterial so long as the present teachings remain operable. Moreover, in some embodiments two or more steps or actions can be conducted simultaneously.

A method of making a semiconductor devices such as a vertical junction field-effect transistor (VJFET) or a bipolar junction transistors (BJT) is described herein. The method does not require ion implantation.

The devices can be made from a wide-bandgap semiconductor material such as silicon carbide (SiC). The devices can therefore be used in high temperature applications.

Figure 1A:
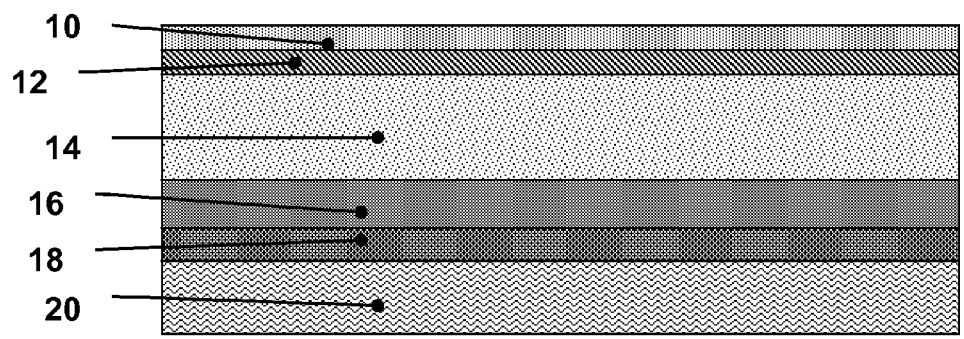
FIGS. 1A-1Q depict a method of making a vertical junction field effect transistor according to various embodiments.
Figure 1B:
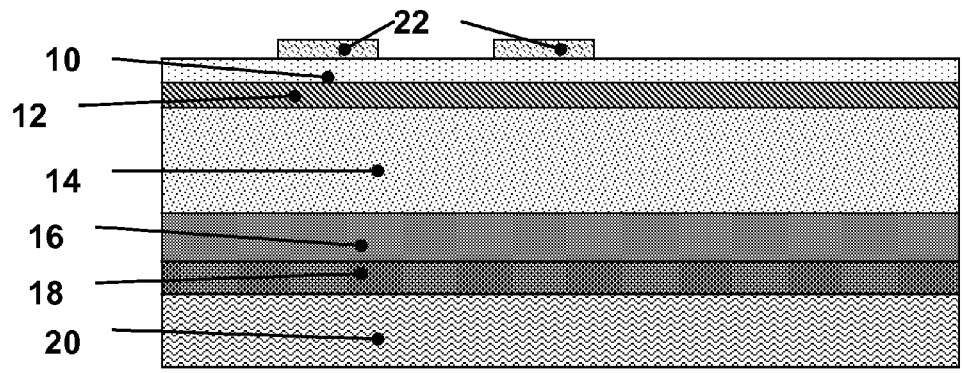
Figure 1C:
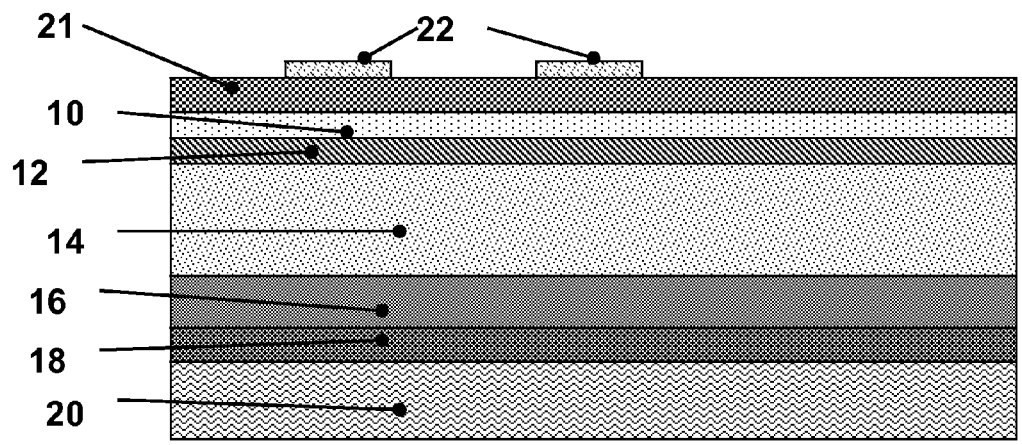
Figure 1D:
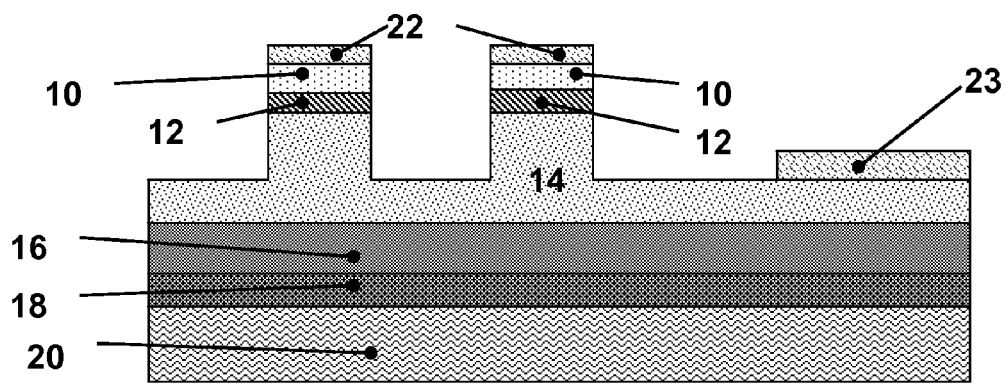
Figure 1E:
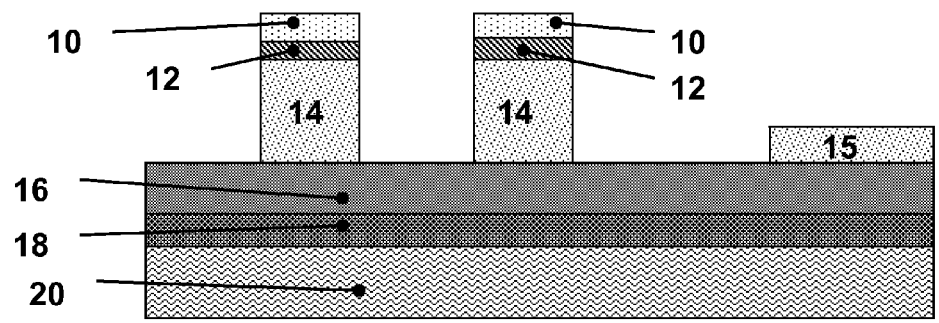
Figure 1F:
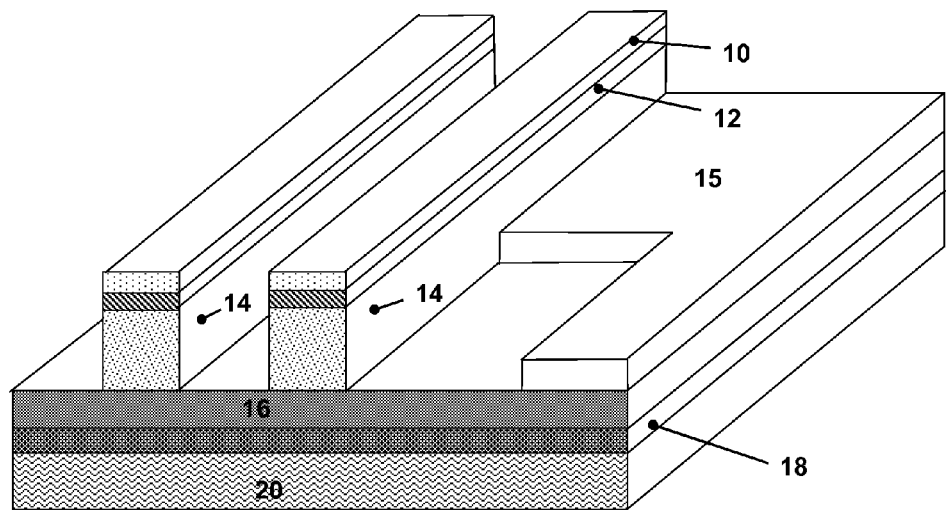
Figure 1G:
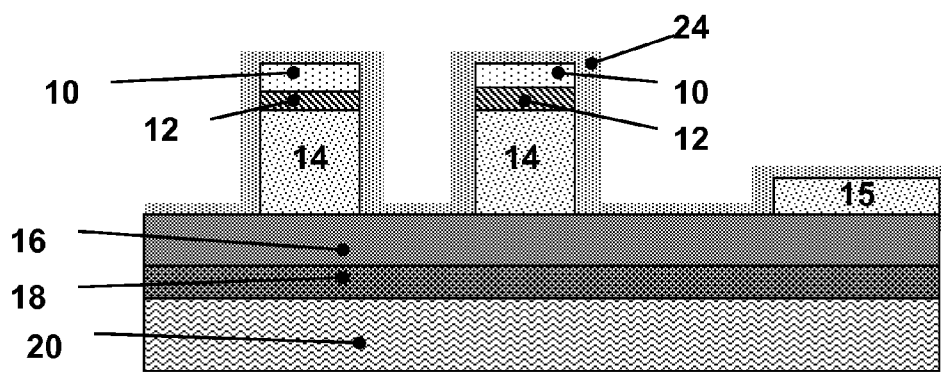
Figure 1H:
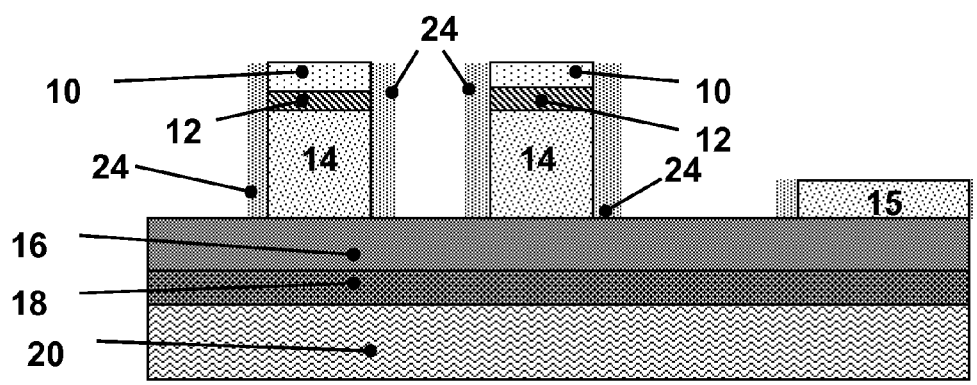
Figure 1I:
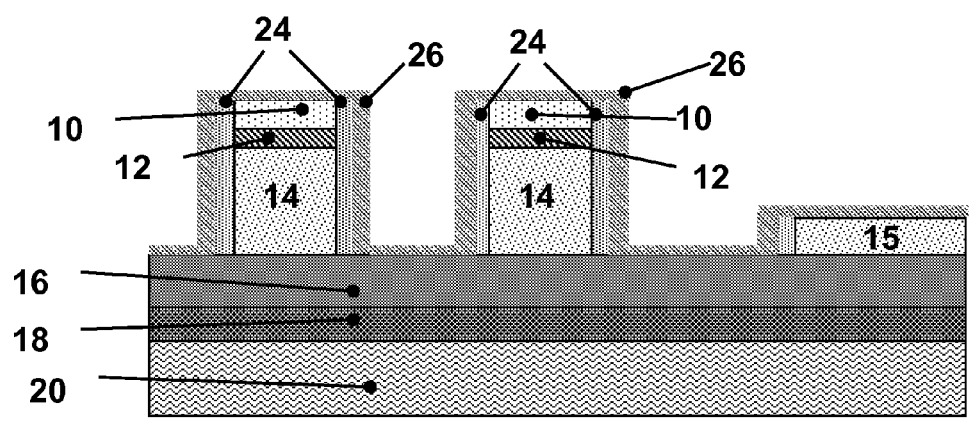
Figure 1J:
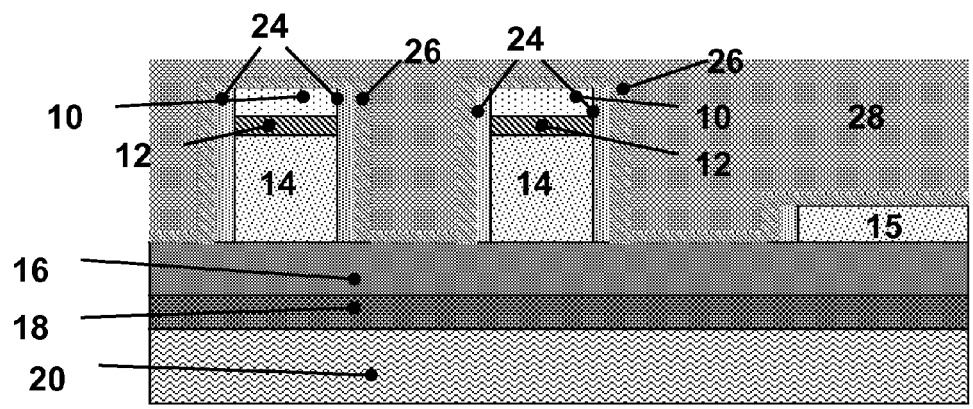
Figure 1K:
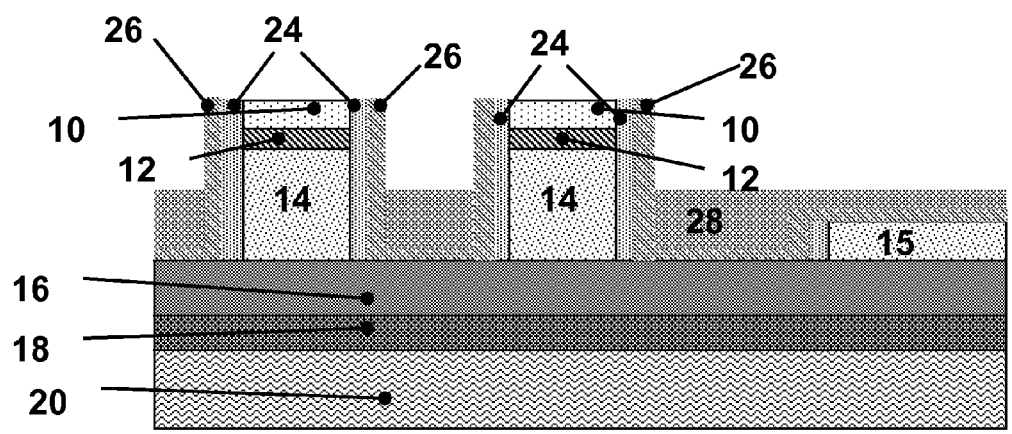
Figure 1L:
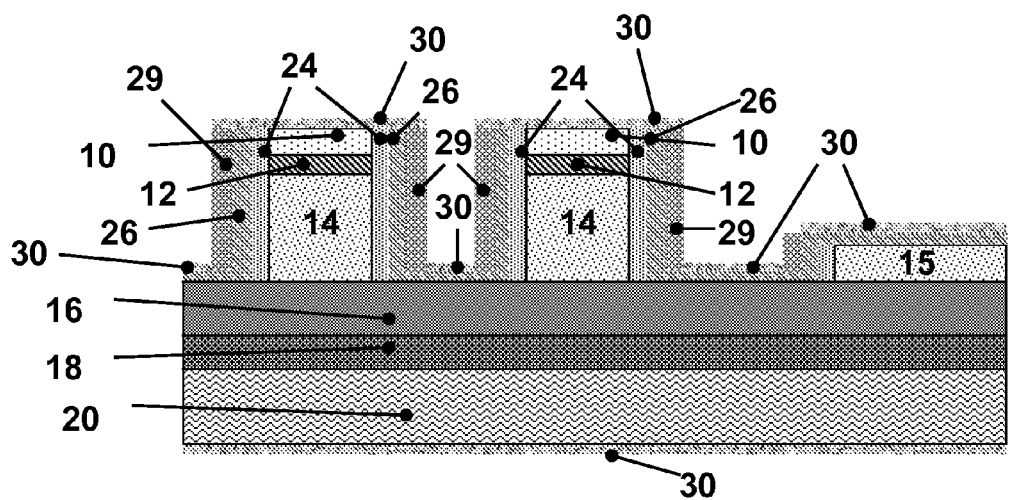
Figure 1M:
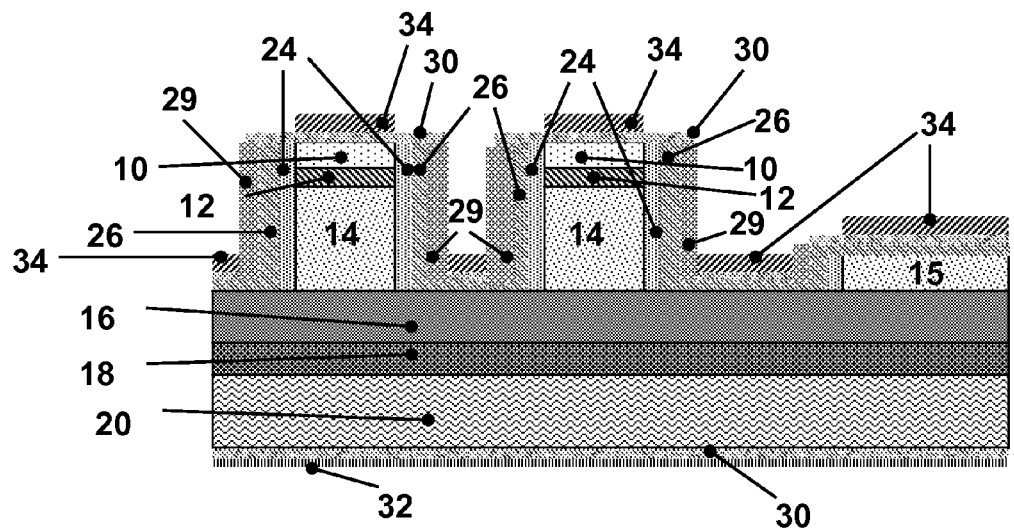
Figure 1N:
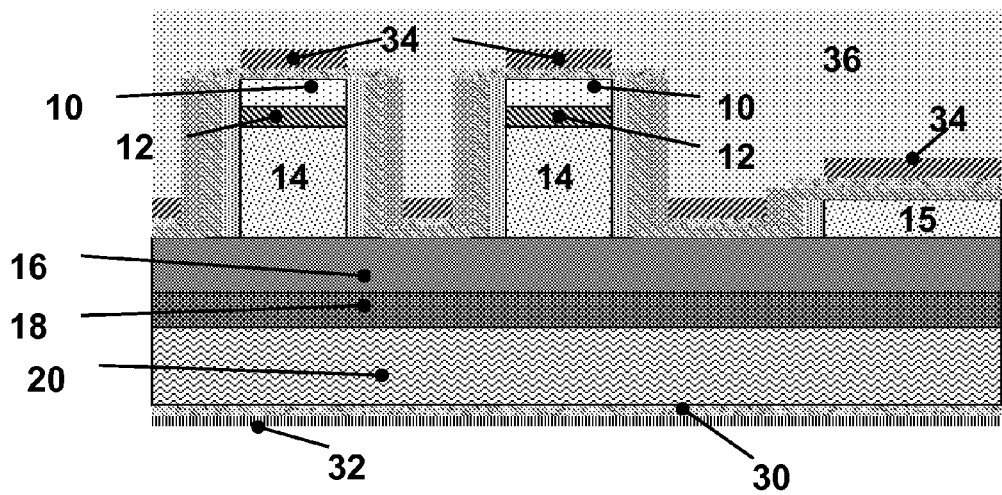
Figure 1O:
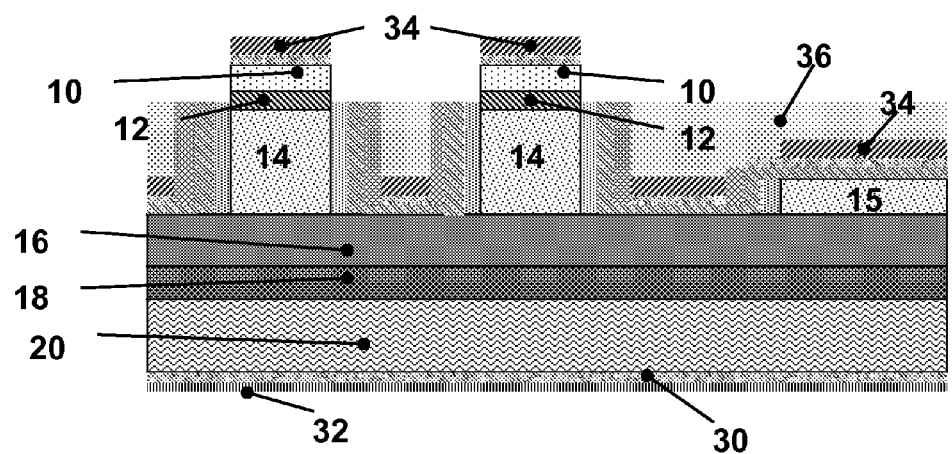
Figure 1P:
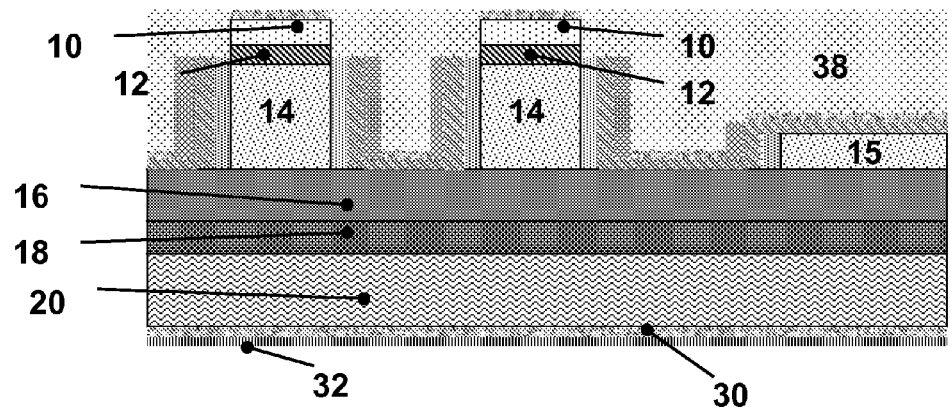

A method of making a vertical junction field-effect transistor according to various embodiments is depicted in FIGS. 1A-1P. As shown in FIG. 1A, an N$^+$ source layer 10 is on an N$^-$ isolation layer 12 which is on a P$^+$ buried gate layer 14 which is on an N$^-$ drift layer 16 which is on a N$^+$ buffer layer 18 which is on an N$^+$ substrate 20. The N$^+$ source layer 10 can have a thickness of 0.5 μm and a doping concentration of >1×10$^{19}$/cm$^3$. The N$^-$ isolation layer 12 can have a thickness of >0.5 μm and a doping concentration of 1×10$^{15}$-1×10$^{17}$/cm$^3$. The P$^+$ buried gate layer 14 can have a thickness of >1 μm and a doping concentration of >1×10$^{19}$/cm$^3$. The N$^-$ drift layer 16 can have a thickness of >0.5 μm and a doping concentration of 1×10$^{15}$-5×10$^{15}$/cm$^3$. The N$^+$ buffer layer 18 can have a thickness of 0.5 μm and a doping concentration of >1×10$^{19}$/cm$^3$. The N$^+$ substrate 20 can have a doping concentration of >5×10$^{18}$/cm$^3$. The various semiconductor layers 12, 14, 16, 18 and 20 can be made from a wide band-gap semiconductor material such as silicon carbide (SiC).

As shown in FIG. 1B, a first etch mask 22 can then be positioned on the N$^+$ source layer 10. The etch mask 22 can comprise Ni or another metal.

Alternatively, as shown in FIG. 1C, an epitaxial regrowth mask layer 21 can be deposited on the N$^+$ source layer 10 and the etch mask 22 can be positioned on the epitaxial regrowth layer 21. The epitaxial regrowth mask layer 21 can be C or TaC. The epitaxial regrowth mask layer can have a thickness of 0.5 μm or more.

As shown in FIG. 1D, the epitaxial regrowth layer 21 (if present), the underlying N$^+$ source layer 10, and the N$^-$ isolation layer 12 can be etched through and the P$^+$ buried gate layer 14 can be partially etched into. Without removing the first etch mask 22, a second etch mask 23 can then be patterned on exposed portions of the P$^+$ buried gate layer 14 in a peripheral region of the device. The second etch 23 mask can be a photoresist material.

The P$^+$ buried gate layer 14 can then be selectively etched using the first etch mask 22 and the second etch mask 23 to expose underlying N$^-$ drift layer as shown in FIG. 1E and thereby forming a region of p-type material 15 in a peripheral portion of the device. A perspective view of the device of FIG. 1E showing the region of p-type material 15 in the peripheral portion of the device is shown in FIG. 1F.

As shown in FIG. 1G, an N-type channel layer 24 can then be epitaxially grown (i.e., regrown) on the upper surfaces and sidewalls of the raised regions and on the bottom surfaces of the trenches.

As shown in FIG. 1H, etching (e.g., blanket etching) can then be used to remove the N-type channel layer 24 from the bottom surfaces of the trenches and from the upper surfaces of the raised regions leaving N-type channel layer 24 on the sidewalls of the raised regions. A sacrificial oxide layer (not shown) can then be grown to remove etching damage.

As shown in FIG. 1I, a conforming P$^+$ layer 26 can then be epitaxially grown (i.e., regrown) on the N-type channel layer 24 on the sidewalls of the raised regions, on the upper surfaces of the raised regions, on the bottom surfaces of the trenches and on the P$^+$ buried gate layer material 15 in the field area of the device. The P$^+$ regrown layer can have a thickness of 0.2 μm and a doping concentration of >1×10$^{19}$/cm$^3$.

As shown in FIG. 1J, the trench fill step can then be performed. The trench fill material 28 can be a photoresist or an oxide. The upper surface of the trench fill material can then be planarized.

As shown in FIG. 1K, the trench fill material 28 can then be etched (e.g., via blanket etching) to remove the P$^+$ regrown layer 26 from the upper surfaces of the raised regions. During the etching, the P$^+$ regrown layer at the trench bottom surfaces of the trenches is protected by the trench fill material 28.

A mesa etch or mesa edge termination process can then be carried out (not shown).

As shown in FIG. 1L, the trench fill material 28 can then be removed. An oxide layer 29 can then be deposited on the front side of the device and removed from the horizontal surfaces leaving oxide layer 29 on the sidewalls of the trenches and on the sidewalls of the P$^+$ material 15 in the field area of the device.

As also shown in FIG. 1L, ohmic contacts 30 can then be formed on the upper surfaces of the raised regions, on the upper surface of the P$^+$ regrown layer on the P$^+$ material 15 in the field area of the device and on the substrate 20 opposite the buffer layer 18.

The ohmic contacts 30 can be formed by depositing a silicide layer on the underlying layer of semiconductor material and then annealing to react the silicide layer with the underlying semiconductor material. The ohmic contacts 30 on the upper surfaces of the raised regions, the ohmic contacts 30 on the epitaxially grown p-type gate layer 26 adjacent the raised regions and the ohmic contact 30 on the epitaxially grown p-type gate layer 30 on the p-type material 15 in the peripheral region of the device can be formed using a self-aligned silicide process (i.e., a salicide process).

As shown in FIG. 1M, etch masks 34 can then be formed on the upper surfaces of the raised regions and on the bottom surfaces of the trenches. The etch masks 34 can be formed by a self-aligned process.

As also shown in FIG. 1M, a backside metal layer 32 can be formed on the ohmic contact 30 on the substrate 20.

As shown in FIG. 1N, the trenches are then filled with a trench fill material 36. The trench fill material 36 can be a photoresist.

As shown in FIG. 1O, the trench fill material 36 can then be etched to remove P+ gate layer 26 and N-type channel layer 24 from upper portions of the sidewalls of the raised regions such that N+ source layer 10 does not contact the N-type channel layer 24 on the sidewalls of the raised regions.

As shown in FIG. 1P, the remaining trench fill material 36 can then be removed. The trenches can then be filled with a trench fill material 38. The trench fill material 38 can be an oxide. A passivation step can then be conducted.

Figure 1Q:
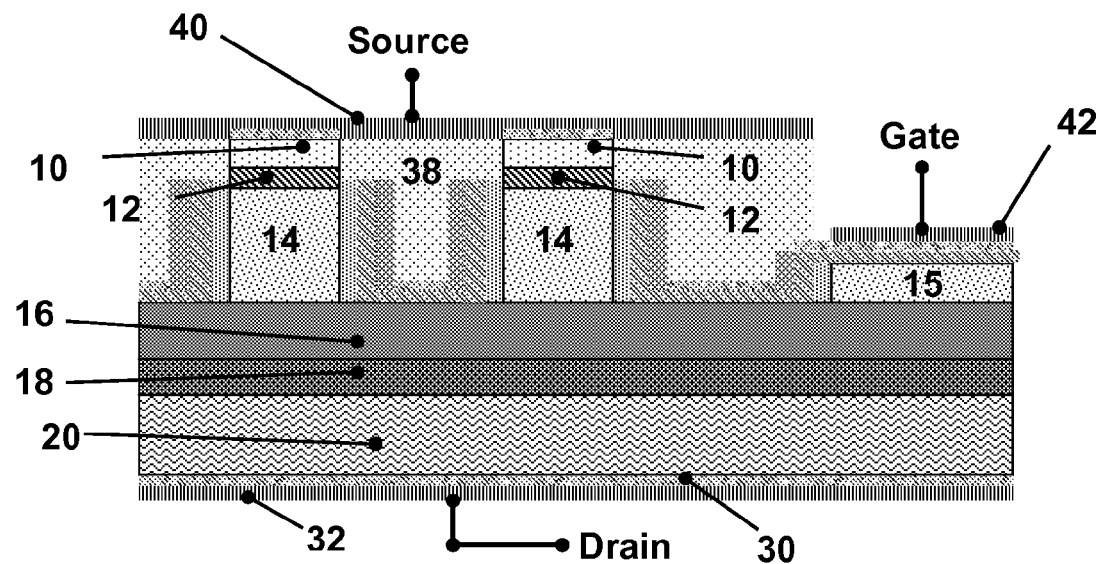

As shown in FIG. 1Q, the trench fill material 38 can then be etched back to expose the source ohmic contacts 30. As also shown in FIG. 1Q, the trench fill material 38 can be selectively etched in a peripheral portion of the device to expose the gate ohmic contact 30. The source final metal layer 40 and gate final metal layer 42 can then be formed on the source and on the gate ohmic contacts, respectively.

The devices described herein can be enhancement mode devices or depletion mode devices.

The devices described herein can be junction field effect transistors (JFETs) or bipolar junction transistors (BJTs). For BJTs, a p-type layer can be substituted for the N-type channel layer of the device depicted in FIGS. 1A-1Q.

All channel, drift, source/emitter, drain/collector and gate regions can be made using epitaxial growth. Accordingly, the method does not require ion-implantation.

The semiconductor devices described herein can be used in various devices including, but not limited to, power switches in PFC modules, DC/DC or DC/AC invertors or motor drives.

The semiconductor material used to manufacture the device can be a wide-bandgap semiconductor material (i.e., a semiconductor material with $E_G>2$ eV). Exemplary non-limiting examples of wide-bandgap semiconductor materials include silicon carbide (SiC) and Group III nitride compounds (e.g., gallium nitride GaN).

The layers of the device can be formed by doping the layers with donor or acceptor materials using known techniques. Exemplary donor materials for SiC include nitrogen and phosphorus. Nitrogen is a preferred donor material for SiC. Exemplary acceptor materials for doping SiC include boron and aluminum. Aluminum is a preferred acceptor material for SiC. The above materials are merely exemplary, however, and any acceptor and donor materials which can be doped into silicon carbide can be used.

The dopant concentrations and thicknesses of the various layers of the device described herein can be varied to produce a device having desired characteristics for a particular application. Similarly, the dimensions of the various features of the device can also be varied to produce a device having desired characteristics for a particular application.

The layers of semiconductor material can be formed by epitaxial growth on a suitable substrate. The layers can be doped during epitaxial growth.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A semiconductor device made by a method comprising:
    forming a first etch mask on an n-type source layer, wherein the n-type source layer is on an n-type isolation layer, wherein the n-type isolation layer is on a p-type buried gate layer, wherein the p-type buried gate layer is on an n-type drift layer, wherein the n-type drift layer is on an n-type buffer layer and wherein the n-type buffer layer is on an n-type substrate;
    selectively etching through the source and isolation layers and into the buried gate layer using the first etch mask to form raised source regions having upper surfaces and sidewalls, the etching exposing the buried gate layer adjacent the raised regions;
    positioning a second etch mask on a portion of the exposed buried gate layer in what is to be a peripheral portion of the device;
    selectively etching through the buried gate layer using the first and second etch masks to expose n-type drift layer adjacent the raised regions thereby forming a region of p-type material in what is to be the peripheral portion of the device having an upper surface and sidewalls, wherein the p-type material in the raised source regions is in contact with the region of p-type material in what is to be the peripheral portion of the device;
    removing the first and second etch masks;
    epitaxially growing an n-type channel layer on the upper surfaces and sidewalls of the raised regions, on the exposed surfaces of the drift layer adjacent the raised regions and on the region of p-type material in what is to be the peripheral portion of the device;
    selectively etching the n-type channel layer to expose the source layer on the upper surfaces of the raised regions, the drift layer adjacent the raised regions and the upper surface of the region of p-type material in what is to be the peripheral portion of the device;
    epitaxially growing a p-type gate layer on the upper surfaces of the raised regions, on the n-type channel layer on the sidewalls of the raised regions, on the exposed surfaces of the drift layer and on the region of p-type material in what is to be the peripheral portion of the device;
    planarizing with a first planarizing material;
    etching the first planarizing material to remove the epitaxially grown p-type gate layer from the upper surfaces of the raised regions;
    removing the first planarizing material;
    depositing an oxide layer on the sidewalls of the raised regions;
    forming ohmic contacts on the upper surfaces of the raised regions, on the epitaxially grown p-type gate layer adjacent the raised regions and on the epitaxially grown p-type gate layer in what is to be the peripheral region of the device;
    forming an ohmic contact on the substrate layer opposite the buffer layer;
    depositing etch mask material on the ohmic contact material on the epitaxially grown p-type gate layer and on the ohmic contact material on the upper surfaces of the raised regions such that epitaxially grown channel and gate layer on the sidewalls of the raised regions is not masked;

planarizing with a second planarizing material;

etching the second planarizing material to remove the epitaxially grown p-type gate and n-type channel layers from an upper portion of the sidewalls of the raised regions;

removing the second planarizing material and the etch mask material;

planarizing with a third planarizing material;

etching the third planarizing material to expose ohmic contact material on the upper surfaces of the raised regions;

selectively etching through the third planarizing material in what is to be the peripheral portion of the device to expose ohmic contact material on the epitaxially grown p-type gate layer;

forming metal contacts on the ohmic contacts on the upper surfaces of the raised regions;

forming a metal contact on the ohmic contact on the epitaxially grown p-type gate layer in what is to be the peripheral portion of the device; and forming a metal contact on the ohmic contact on the substrate layer.

2. The device of claim 1, wherein:

the source layer has a thickness of 0.4 to 0.6 μm and a dopant concentration greater than $1\times10^{19}/cm^3$;

the isolation layer has a thickness greater than 0.5 μm and a dopant concentration of $1\times10^{15}-1\times10^{17}/cm^3$;

the buried gate layer has a thickness greater than 1 μm and a dopant concentration greater than $1\times10^{19}/cm^3$;

the drift layer has a thickness greater than 0.5 μm and a dopant concentration of $1\times10^{15}-5\times10^{15}/cm^3$;

the buffer layer has a thickness of 0.4 to 0.6 μm and a dopant concentration greater than $1\times10^{19}/cm^3$;

the epitaxially grown p-type gate layer has a thickness greater than 0.2 μm and a dopant concentration greater than $1\times10^{19}/cm^3$; and the substrate layer has a dopant concentration greater than $5\times10^{18}/cm^3$.

3. The device of claim 1, wherein the semiconductor material of the source layer, the isolation layer, the buried gate layer, the drift layer, the buffer layer, the substrate, the epitaxially grown channel layer and the epitaxially grown gate layer is a wide-bandgap semiconductor material.

4. The device of claim 3, wherein the semiconductor material of the source layer, the isolation layer, the buried gate layer, the drift layer, the buffer layer, the substrate, the epitaxially grown channel layer and the epitaxially grown gate layer is SiC.

5. A circuit comprising one or more semiconductor devices as set forth in claim 1.

6. A semiconductor device comprising:

raised source regions in a central portion of the device, the raised source regions having upper surfaces and sidewalls, wherein the raised source regions each comprise an n-type source layer on an n-type isolation layer, the n-type isolation layer being on a first p-type gate layer, wherein the raised source regions are on an n-type drift layer, wherein the n-type drift layer is on an n-type buffer layer and wherein the n-type buffer layer is on an n-type substrate;

a region of p-type material on the n-type drift layer in a peripheral portion of the device, the region of p-type material having an upper surface and sidewalls, wherein the p-type gate layers of the raised source regions are in electrical contact with the region of p-type material in the peripheral portion of the device;

an n-type channel layer or a p-type base layer on a lower portion of the sidewalls of the raised source regions and on the sidewalls of the region of p-type material in the peripheral portion of the device, wherein the n-type channel or p-type base layer does not contact the n-type source layer on the sidewalls of the raised source regions;

a second p-type gate layer on the n-type channel or p-type base layer on the sidewalls of the raised source regions, on the exposed surfaces of the drift layer adjacent the raised source regions and on the upper surface and sidewalls of the region of p-type material in the peripheral portion of the device;

an oxide layer on the second p-type gate layer on the sidewalls of the raised source regions and on the second p-type gate layer on the sidewalls of the region of p-type material in the peripheral portion of the device;

a source ohmic contact on the upper surfaces of the raised source regions;

a gate ohmic contact on the second p-type gate layer on the drift layer adjacent the raised source regions and on the second p-type gate layer on the upper surface of the region of p-type material in the peripheral portion of the device; and a drain ohmic contact on the substrate layer opposite the buffer layer.

7. The device of claim 6, wherein the raised source regions are spaced apart from one another thereby forming trenches between adjacent raised source regions, the device further comprising a planarizing material filling the trenches between the raised source regions, wherein the planarizing material does not cover the source ohmic contacts or the gate ohmic contact on the epitaxially grown p-type gate layer in the peripheral portion of the device.

8. The device of claim 7, wherein the planarizing material is an oxide.

9. The device of claim 7, further comprising a source metal contact layer on the source ohmic contacts on the upper surfaces of the raised source regions and on an upper surface of the planarizing material adjacent and between the raised source regions.

10. The device of claim 7, further comprising a gate metal contact on the gate ohmic contact.

11. The device of claim 7, further comprising a drain metal contact on the drain ohmic contact.

12. The device of claim 7, wherein:

the source layer has a thickness of 0.4 to 0.6 μm and a dopant concentration greater than $1\times10^{19}/cm^3$;

the isolation layer has a thickness greater than 0.5 μm and a dopant concentration of $1\times10^{15}-1\times10^{17}/cm^3$;

the first gate layer has a thickness greater than 1 μm and a dopant concentration greater than $1\times10^{19}/cm^3$;

the drift layer has a thickness greater than 0.5 μm and a dopant concentration of $1\times10^{15}-5\times10^{15}/cm^3$;

the buffer layer has a thickness of 0.4 to 0.6 μm and a dopant concentration greater than $1\times10^{19}/cm^3$;

the second p-type gate layer has a thickness greater than 0.2 μm and a dopant concentration greater than $1\times10^{19}/cm^3$; and the substrate layer has a dopant concentration greater than $5\times10^{18}/cm^3$.

13. The device of claim 6, wherein the semiconductor material of the source layer, the isolation layer, the first gate layer, the drift layer, the buffer layer, the substrate, the channel or base layer and the second gate layer is a wide-bandgap semiconductor material.

14. The device of claim 6, wherein the semiconductor material of the source layer, the isolation layer, the first gate layer, the drift layer, the buffer layer, the substrate, the channel or base layer and the second gate layer is SiC.

15. The device of claim 6, wherein the device comprises the n-type channel layer and wherein the device is a junction field effect transistor (JFET).

16. The device of claim 6, wherein the device comprises the p-type base layer and wherein the device is a bipolar junction transistor (BJT).

17. The device of claim 6, wherein the source layer, the isolation layer, the first gate layer, the drift layer, the buffer layer, the channel or base layer and the second gate layer are epitaxial layers.

18. A circuit comprising one or more semiconductor devices as set forth in claim 6.

* * * * *